(12) United States Patent  
Zhang et al.

(10) Patent No.: US 9,059,559 B2  
(45) Date of Patent: Jun. 16, 2015

(54) SAGNAC LOOP MIRROR BASED LASER CAVITY ON SILICON PHOTONICS PLATFORM

(71) Applicant: Coriant Advanced Technology, LLC, New York, NY (US)

(72) Inventors: Yi Zhang, Jersey City, NJ (US); Shuyu Yang, Jersey City, NJ (US); Michael J. Hochberg, New York, NY (US); Thomas Baehr-Jones, Arcadia, CA (US)

(73) Assignee: Coriant Advanced Technology, LLC, New York, NY (US)

( * ) Notice: Subject to any disclaimer, the term of this patent is extended or adjusted under 35 U.S.C. 154(b) by 0 days.

(21) Appl. No.: 14/549,130

(22) Filed: Nov. 20, 2014

(65) Prior Publication Data

US 2015/0139264 A1    May 21, 2015

Related U.S. Application Data

(60) Provisional application No. 61/906,529, filed on Nov. 20, 2013.

(51) Int. Cl.
| | |
|---|---|
| *H01S 3/08* | (2006.01) |
| *H01S 3/081* | (2006.01) |
| *H01S 5/14* | (2006.01) |
| *H01S 5/40* | (2006.01) |
| *H01S 3/00* | (2006.01) |

(52) U.S. Cl.  
CPC .............. *H01S 3/081* (2013.01); *H01S 5/146* (2013.01); *H01S 5/141* (2013.01); *H01S 5/14* (2013.01); *H01S 5/4062* (2013.01); *H01S 3/005* (2013.01); *H01S 3/0078* (2013.01)

(58) Field of Classification Search  
CPC .......... H01S 5/146; H01S 5/141; H01S 5/14; H01S 5/4062; H01S 3/0078; H01S 3/005  
USPC .............................................. 372/99, 108, 98  
See application file for complete search history.

(56) References Cited

U.S. PATENT DOCUMENTS

| | | | | |
|---|---|---|---|---|
| 5,778,014 | A | * | 7/1998 | Islam ............................... 372/6 |
| 6,052,393 | A | * | 4/2000 | Islam ............................... 372/6 |
| 6,567,430 | B1 | * | 5/2003 | Islam et al. ....................... 372/3 |
| 8,130,802 | B2 | * | 3/2012 | Huber ............................. 372/20 |
| 2003/0053192 | A1 | * | 3/2003 | Islam et al. .................... 359/327 |

OTHER PUBLICATIONS

Shu, X. et al., "Fiber grating Sagnac loop and its multiwavelength-laser application," IEEE Photonics Technology Letters, vol. 12, pp. 980-982, Aug. 2000.

Zhou, J. et al., "All-fiber mode-locked ring laser with a Sagnac filter," IEEE Photonics Technology Letters, vol. 23, pp. 1301-1303, Sep. 15, 2011.

* cited by examiner

*Primary Examiner* — Kinam Park  
(74) *Attorney, Agent, or Firm* — Milstein Zhang & Wu LLC; Joseph B. Milstein

(57) ABSTRACT

We have demonstrated a novel Sagnac loop and micro-ring based laser cavity which is simple and reliable, with accurately controlled reflectivity and negligible excess loss. The resonant wavelength of a 2 μm radius micro-ring is shown to be lithographically controlled to a standard deviation of 3.6 nm. Both C- and O-Band lasers based on Sagnac loop mirror and micro-ring cavity have been demonstrated. The lasers are shown to be able to be modulated at 40 Gb/s.

21 Claims, 16 Drawing Sheets

SAGNAC LOOP MIRROR BASED LASER CAVITY ON SILICON PHOTONICS PLATFORM

CROSS-REFERENCE TO RELATED APPLICATIONS

This application claims priority to and the benefit of U.S. provisional patent application Ser. No. 61/906,529, filed Nov. 20, 2013, which application is incorporated herein by reference in its entirety.

STATEMENT REGARDING FEDERALLY FUNDED RESEARCH OR DEVELOPMENT

This invention was made with government support under FA-9550-10-1-0439 awarded by Air Force Office of Scientific Research (AFOSR). The government has certain rights in the invention.

FIELD OF THE INVENTION

The invention relates to optical cavities in general and particularly to an optical cavity that can be used with lasers.

BACKGROUND OF THE INVENTION

Semiconductor lasers and optical amplifiers are preferred in transceivers because they are efficiently electrically pumped and the die size is small. Lasing is a radiative recombination process in semiconductors, where an electron in the conduction recombines with a hole in the valance band and a photon is emitted. The reverse process is electron hole pair generation through optical absorption, as occurs in such devices as photodetectors and solar cells.

Silicon photonics is widely seen as an enabling technology to address the exponentially increasing demand for data communication bandwidth. Lasers are critical components in data transmission systems. Two fundamental elements for a laser are its gain medium and resonating cavity. Due to the indirect bandgap of silicon, several approaches of introducing gain medium into the photonic integration material system has been reported, including edge coupled bonding (see, for example A. J. Zilkie, P. Seddighian, B. J. Bijlani, W. Qian, D. C. Lee, S. Fathololoumi, J. Fong, R. Shafiiha, D. Feng, B. J. Luff, X. Zheng, J. E. Cunningham, A. V. Krishnamoorthy, and M. Asghari, "Power-efficient III-V/Silicon external cavity DBR lasers," Optics Express, Vol. 20, pp. 23456-23462, 2012; S. Tanaka, S. H. Jeong, S. S., T. Kurahashi, Y. Tanaka, and K. Morito, "High-output-power, single-wavelength silicon hybrid laser using precise flip-chip bonding technology," Optics Express, Vol. 20, pp. 28057-28069, 2012), direct bonding (see, for example A. W. Fang, H. Park, O. Cohen, R. Jones, M. J. Paniccia, and J. E. Bowers, "Electrically pumped hybrid AlGaInAs-silicon evanescent laser," Optics Express, Vol. 14, pp. 9203-9210, 2006; S. Keyvaninia, G. Roelkens, D. Van Thourhout, C. Jany, M. Lamponi, A. Le Liepvre, F. Lelarge, D. Make, G. H. Duan, D. Bordel, and J. M. Fedeli, "Demonstration of a heterogeneously integrated III-V/SOI single wavelength tunable laser," Optics Express, Vol. 21, pp. 3784-3792, 2012; T. Creazzo, E. Marchena, S. B. Krasulick, P. Yu, D. Van Orden, J. Y. Spann, C. C. Blivin, L. He, H. Cai, J. M. Dallesasse, R. J. Stone, and A. Mizrahi, "Integrated tunable CMOS laser," Optics Express, Vol. 21, pp. 28048-28053, 2013), heavily N-doped germanium (see, for example R. E. Camacho-Aguilera, Y. Cai, N. Patel, J. T. Bessette, M. Romagnoli, L. C. Kimerling, and J. Michel, "An electrically pumped germanium laser," Optics Express, Vol. 20, pp. 11316-11320, 2012), and quantum dot structures (see, for example T. Wang, H. Liu, A. Lee, F. Pozzi, and A. Seeds, "1.3-μm InAs/GaAs quantum-dot lasers monolithically grown on Si substrates," Optics Express, Vol. 19, Issue 12, pp. 11381-11386 (2011)). Laser cavities are usually built using Distributed Bragg Reflectors (DBRs), or DBRs together with ring resonator filters, which require high lithography resolution and are sensitive to fabrication variations.

Conservation of both energy and momentum are required in the lasing process. Energy conservation is satisfied because the emitted photon's energy is equal to the bandgap of the semiconductor. However, a photon's momentum is negligible compared to that of an electron or a hole. To meet the momentum conservation requirement, the top of the valence band and the bottom of the conduction band need to be aligned. In other words, the semiconductor needs to be a direct bandgap material. A number of III-V compound materials such as gallium arsenide (GaAs) and indium phosphide (InP) are direct bandgap semiconductors. However, silicon is an indirect bandgap semiconductor.

Raman silicon lasers have been demonstrated. Making an electrically pumped silicon laser is prohibitively difficult. Another gain material has to be introduced into the silicon material system in which laser action is desired. Various gain integration approaches have been reported, including monolithic epitaxy, wafer bonding, and SOA edge coupling.

X. Shu, S. Jiang, and D. Huang, "Fiber grating Sagnac loop and its multiwavelength-laser application," IEEE Photonics Technology Letters, Vol. 12, pp. 980-982, 2000 is said to describe a novel simple comb filter, which is based on a Sagnac interferometer with a fiber Bragg grating asymmetrically located in its fiber loop. The filter has advantages of simple design and easy fabrication, low insertion loss and low cost. Two filters with triple bandpasses and dual bandpasses, respectively, were fabricated and applied to an erbium-doped fiber ring laser. Stable triple-wavelength and dual-wavelength laser operations have been demonstrated.

J. Zhou, P. Yan, H. Zhang, D. Wang, and M. Gong, "All-fiber mode-locked ring laser with a Sagnac filter," IEEE Photonics Technology Letters, Vol. 23, pp. 1301-1303, 2011 is said to describe the following: Terbium-doped mode-locked fiber lasers are versatile sources of femtosecond pulses. The development of new pulse-shaping mechanisms in fiber lasers allows the generation of higher energy femtosecond pulses than the soliton mode-locked lasers which are required in the application. However the pulses from Yb-doped mode-locked fiber lasers are longer in width than the soliton pulses due to the normal dispersion of the fiber. Thus grating pairs are necessary in and out of the cavity to provide negative dispersion. An All-Normal-Dispersion (ANDi) Yb-doped fiber laser has been demonstrated with a spectral filter instead of the grating pair in the cavity. The spectral filtering of a highly-chirped pulse in the laser cavity is the key component of the pulse shaping in this type of mode-locked laser. The influence of the bandwidth of the filter on the mode-locking has been theoretically investigated. The bulk interference or birefringent filter is commonly used as the spectral filter. In order to develop the all-fiber configuration free from misalignment some fiber-type filters have been investigated. Recently an all-fiber Lyot filter with a section of Polarization Maintaining (PM) fiber has been used as the spectral filter in ANDi laser and 240 fs dechirped pulses were obtained. According to the discussion in [2], [3] the duration of the mode locked pulse diminishes with the decrease of the filtering bandwidth until the mode-locking fails. The Lyot filter can be used as a bandwidth-tunable filter as the bandwidth depends on the length of the PM fiber. However the modulation depth of the Lyot filter is dominated by the Polarization Controllers (PCs).

There is a need for an improved external cavity for use with lasers.

SUMMARY OF THE INVENTION

According to one aspect, the invention features an optical cavity. The optical cavity comprises a single optical port configured to provide an optical output beam; a first mirror element comprising a submicron silicon waveguide, the first mirror element having a first transmittance and a first reflectivity, the first mirror element forming a first optical reflector situated at a first end of the optical cavity, the first mirror element in optical communication with the single optical port; a second mirror element having a second transmittance and a second reflectivity, the second mirror element forming a second optical reflector situated at a second end of the optical cavity, at least one of the first mirror element and the second mirror element is a Sagnac loop mirror; and situated in serial optical communication between the first mirror element and the second mirror element: a filter element configured to pass an optical beam having a selected optical wavelength therethrough; and a gain cavity configured to contain therein an optical gain medium.

In another embodiment, the first mirror element is a broadband reflector.

In yet another embodiment, the first mirror element has a reflectivity that increases as the selected wavelength is increased.

In another embodiment, the first mirror element has a variable reflectivity.

In still another embodiment, the filter element is a microring based filter.

In a further embodiment, the filter element is a tunable filter.

In yet a further embodiment, the filter element is a thermally tunable filter.

In an additional embodiment, the filter element has multiple pass bands.

In one more embodiment, the second mirror has a reflectivity defined by a facet.

In still a further embodiment, the selected optical wavelength is a wavelength situated within a wavelength range used in telecommunication.

In one embodiment, the selected optical wavelength is a wavelength situated within the O-Band.

In yet another embodiment, the selected optical wavelength is a wavelength situated within the C-Band.

In still another embodiment, the selected optical wavelength is a wavelength situated within a band selected from the e-Band, the S-Band, the L-Band and the U-Band.

In yet a further embodiment, the optical gain medium is optically coupled to the optical cavity via at least one of a butt-coupler, a taper, an inverse taper, a lens, and a lens array.

In an additional embodiment, the optical cavity is configured to be operated without cooling.

In one more embodiment, the optical cavity is configured to be operated without hermetic sealing. However, it is to be understood that an individual die may comprise hermetic sealing.

In still a further embodiment, the facet comprises an optical coating.

In another embodiment, the optical output beam comprises a single optical wavelength of interest.

In yet another embodiment, the optical output beam comprises a plurality of optical wavelengths of interest.

In still another embodiment, the optical output beam comprises a narrow linewidth optical output beam.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

DETAILED DESCRIPTION

Acronyms

A list of acronyms and their usual meanings in the present document (unless otherwise explicitly stated to denote a different thing) are presented below.

AMR Adabatic Micro-Ring
APD Avalanche Photodetector
ARM Anti-Reflection Microstructure
ASE Amplified Spontaneous Emission
BER Bit Error Rate
BOX Buried Oxide
CMOS Complementary Metal-Oxide-Semiconductor
CMP Chemical-Mechanical Planarization
DBR Distributed Bragg Reflector
DC (optics) Directional Coupler
DC (electronics) Direct Current
DCA Digital Communication Analyzer
DRC Design Rule Checking
DUT Device Under Test
ECL External Cavity Laser
FDTD Finite Difference Time Domain
FOM Figure of Merit
FSR Free Spectral Range
FWHM Full Width at Half Maximum
GaAs Gallium Arsenide
InP Indium Phosphide
LiNO$_3$ Lithium Niobate
LIV Light intensity(L)-Current(I)-Voltage(V)
MFD Mode Field Diameter
MPW Multi Project Wafer
NRZ Non-Return to Zero
PIC Photonic Integrated Circuits
PSO Particle Swarm Optimization
Q Quality factor $$Q = 2\pi \times \frac{\text{Energy Stored}}{\text{Energy dissipated per cycle}} = 2\pi f_p \times \frac{\text{Energy Stored}}{\text{Power Loss}}.$$

QD Quantum Dot
RSOA Reflective Semiconductor Optical Amplifier
SOI Silicon on Insulator
SEM Scanning Electron Microscope
SMSR Single-Mode Suppression Ratio
TEC Thermal Electric Cooler
WDM Wavelength Division Multiplexing Hybrid Laser Integration A high quality laser is critical to the performance of any optical data links. Because silicon doesn't lase at optical wavelengths used for telecommunication, external gain material has to be integrated in a CMOS compatible manner. Silicon waveguide distributed Bragg gratings require sub-50 nm feature size and are difficult to manufacture. A reliable cavity is also needed to provide feedback for lasing operation. We describe a novel laser cavity configuration utilizing a Sagnac loop mirror and micro-ring resonator. Hybrid lasers based on such cavity are demonstrated with 1.2 MHz linewidth, 4.8 mW on-chip output power, and over 40 dB side mode suppression ratio.

High Index Contrast Silicon Waveguides

Figures 1A, 1B:
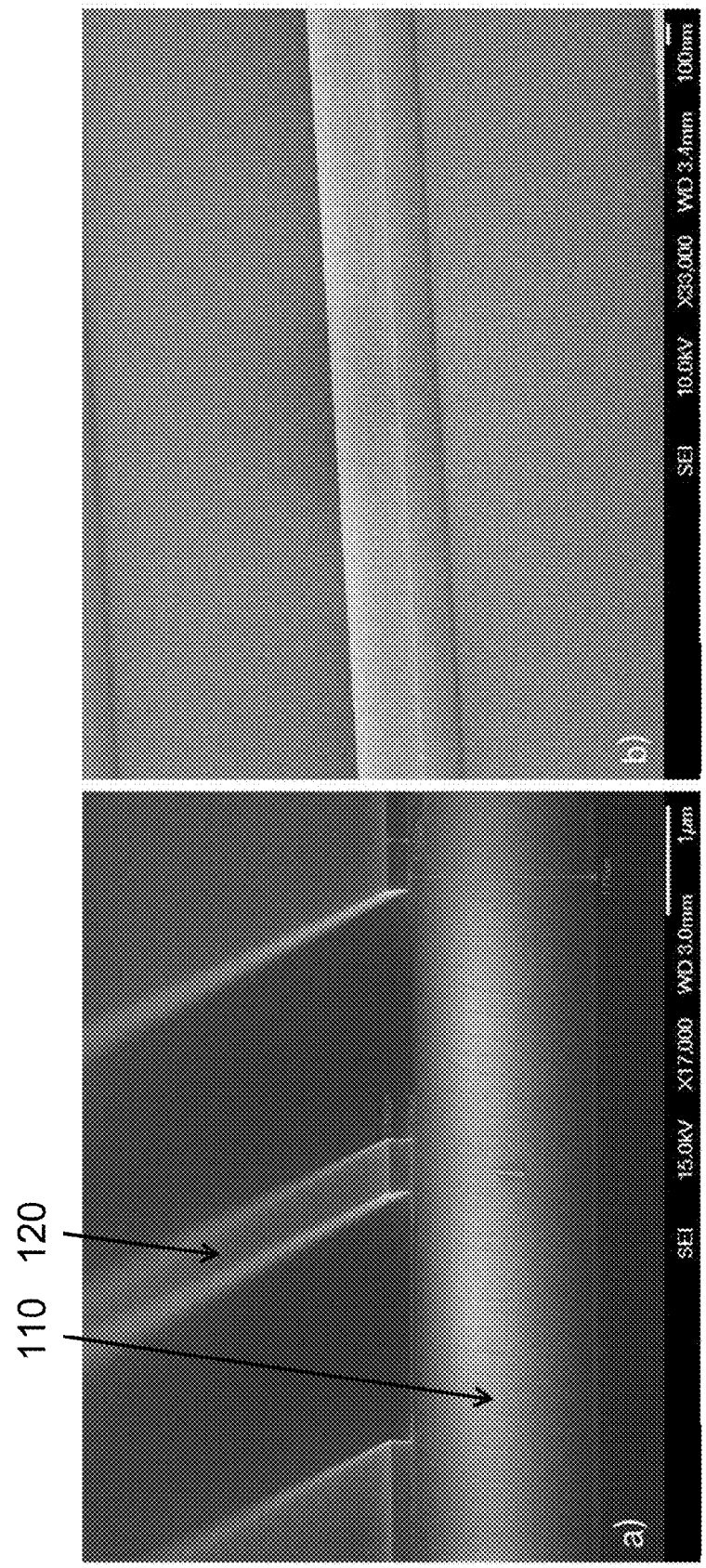
FIG. 1A is a cross sectional SEM image of submicron silicon waveguides.
FIG. 1B is a perspective view SEM image of submicron silicon waveguides.

FIG. 1A is a cross sectional SEM image of submicron silicon waveguides. Both the silicon device layer and the buried oxide are clearly visible in FIG. 1A. The silicon dioxide layer 110 is 1.7 µm thick, the silicon waveguide 120 is 0.17 µm (170 nm) thick and 0.507 µm (507 nm) wide, and a lateral repeat distance between silicon structures is 2.774 µm. The waveguides are patterned using JBX-6300FS electron beam lithography system and etched using an inductively coupled plasma reactive ion etcher.

FIG. 1B is a perspective view SEM image of submicron silicon waveguides.

Sagnac Loop and Micro-Ring External Cavity Laser

The device was fabricated by a foundry. The Sagnac loop mirror transmittance and reflectivity can be predicted analytically as it contains only a directional coupler other than a routing waveguide.

Figure 2:
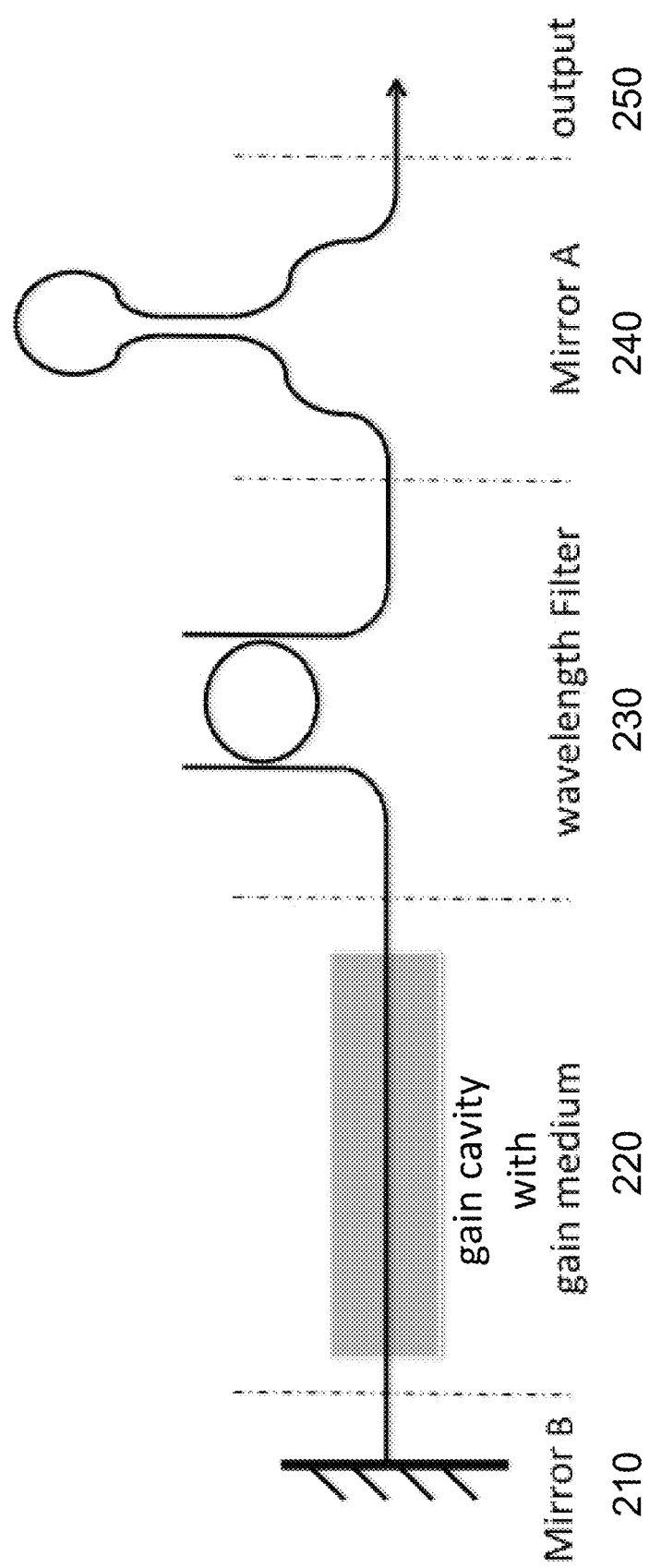
FIG. 2 is a schematic diagram of a Sagnac loop mirror based laser cavity configuration according to principles of the invention.

FIG. 2 is a schematic diagram of a Sagnac loop mirror based laser cavity configuration. The Sagnac loop mirror based laser cavity is a preferred embodiment. The Sagnac loop Mirror A 240 is made up of a directional coupler (DC) with its branches tied together on one side. It contains no ultra-fine features other than two parallel waveguides, and can be fabricated by a single etch step.

In FIG. 2 the filter 230 is a micro-ring that is fixed at a critical coupling condition for wavelength filtering, and the Sagnac loop Mirror A 240 is used for broadband reflection at one end of the cavity. There is only one output port 250. In some embodiments, port 250 can also be used as an input port. The reflectivity of Sagnac loop Mirror A 240 can be accurate controlled by adjusting a coupling length. In some embodiments, a Mirror B 210 having a high reflectivity and low transmittance is used at the other end of the cavity. Implementation of Mirror B 210 depends on the gain medium integration technique. It could be either the high reflection end of a reflective SOA in the case of edge-coupled integration or another Sagnac loop mirror in the case of the direct bonding approach.

A gain medium is provided in a gain cavity 220. As shown in the embodiment of FIG. 2, the Mirror B 210 and the Sagnac loop Mirror A 240 form the ends of an optical cavity (or optical resonator) structure. The gain medium in the gain cavity 220 and the filter 230 are provided within the optical cavity structure in serial communication. In different embodiments, the gain medium in the gain cavity 220 and the filter 230 can be provided in any order, as long as the serial communication is preserved. In preferred embodiments, for purposes of convenience of manufacture, it may be helpful to have the filter 230 and the Sagnac loop Mirror A 240 in physical proximity to each other if the filter 230 is a micro-ring filter. In the embodiment illustrated in FIG. 2, the micro-ring filter 230 and the Sagnac loop Mirror A 240 are independent and can be optimized separately. This is a robust device, with low excess loss.

In the embodiment illustrated in FIG. 2, a racetrack ring resonator 230 was used as the wavelength filter. The ring has a radius of 10 µm, and a 1.5 µm long straight DC to maintain critical coupling. The ring FSR is 8.7 nm, and FWHM is 0.075 nm, corresponding to a Q of 20 000. Because the ring resonator is a comb filter and has multiple pass bands, the device is expected to lase at a resonant wavelength near the top of the SOA gain spectrum.

In some embodiments, the specific structure of the optical cavity can include a reflector that is situated on a silicon chip for example fabricated from an SOI wafer and the gain region is provided by a III/V semiconductor material. The coupling can include one or more of butt-coupling, using tapers or inverse tapers for expanded beam coupling, using lenses for coupling or lens arrays for coupling.

In some embodiments, the optical cavity can be operated using uncooled operation, in which the temperature is allowed to be free-running. In some embodiments, the optical cavity can be operated nonhermetically. In some embodiments, one or more components of the optical cavity can be hermetically sealed at the die level.

In some embodiments, there are included one or more optical coatings on an optical facet, either on the silicon side or on the III/V side or both.

In various embodiments, the optical cavity provides an optical output beam that can comprise a single wavelength of interest, or a plurality of wavelengths of interest. In some embodiments the optical cavity provides an optical output beam that is a narrow linewidth optical output beam Laser Physics An optical cavity or optical resonator comprises mirrors that form a standing wave cavity resonator for light waves. Optical cavities are a major component of lasers, surrounding the gain medium and providing feedback of the laser light. They are also used in optical parametric oscillators and some interferometers. Light confined in the cavity reflects (or passes) multiple times between the mirrors, producing standing waves for certain resonance frequencies. The standing wave patterns produced are referred to as modes. Longitudinal modes differ only in frequency while transverse modes differ for different frequencies and have different intensity patterns across the cross section of the beam.

In a laser, there is a gain medium which amplifies light. Laser pumping involves energy transfer from an external source into the gain medium of a laser. Different gain media can be pumped by various methods, which can include the provision of energy from electrical sources, optical sources, or even chemical sources. The gain medium absorbs energy and creates excited atomic states. When the number of particles in one excited state exceeds the number of particles in the ground state or a less-excited state, population inversion is achieved. When the excited atomic states relax (return to the ground state) a photon is emitted. In lasers, the emission from the excited states can be caused to happen by the presence of photons having energy that matches the energy difference between the excited state and the ground state. The emitted photons have the same wavelength and direction and are in phase with the light that stimulates the excited state to emit, which condition is termed coherency. The emission process in lasers is termed stimulated emission, which is the reason why the name LASER (Light Amplification by Stimulated Emission of Radiation) was selected. In order for laser operation to occur, the pump power must be higher than the lasing threshold of the laser.

In operation, light passes back and forth in the optical cavity between Mirror A 240 and Mirror B 210. The gain medium in the gaiun cavity 220 amplifies the light so that the intensity increases each time the light passes through the gain medium. The filter 230 filters out the wavelengths that are not of interest, so that stimulated emission of those wavelengths is suppressed. To the extent that the filter 230 can be used to select one or nore discrete wavelengths to pass, the wavelength of the laser light can be tuned.

Depending on the type of gain medium that is employed, the power to pump the gain medium can be selected from any convenient power source having the proper characteristics (e.g., electrical power, optical power, or the like). In various embodiments of the invention, the gain medium can be an electrically pumped gain medium, an optically pumped gain medium, or even a chemically pumped gain medium. The gain medium can be a solid, a liquid, or a gas.

Figure 4:
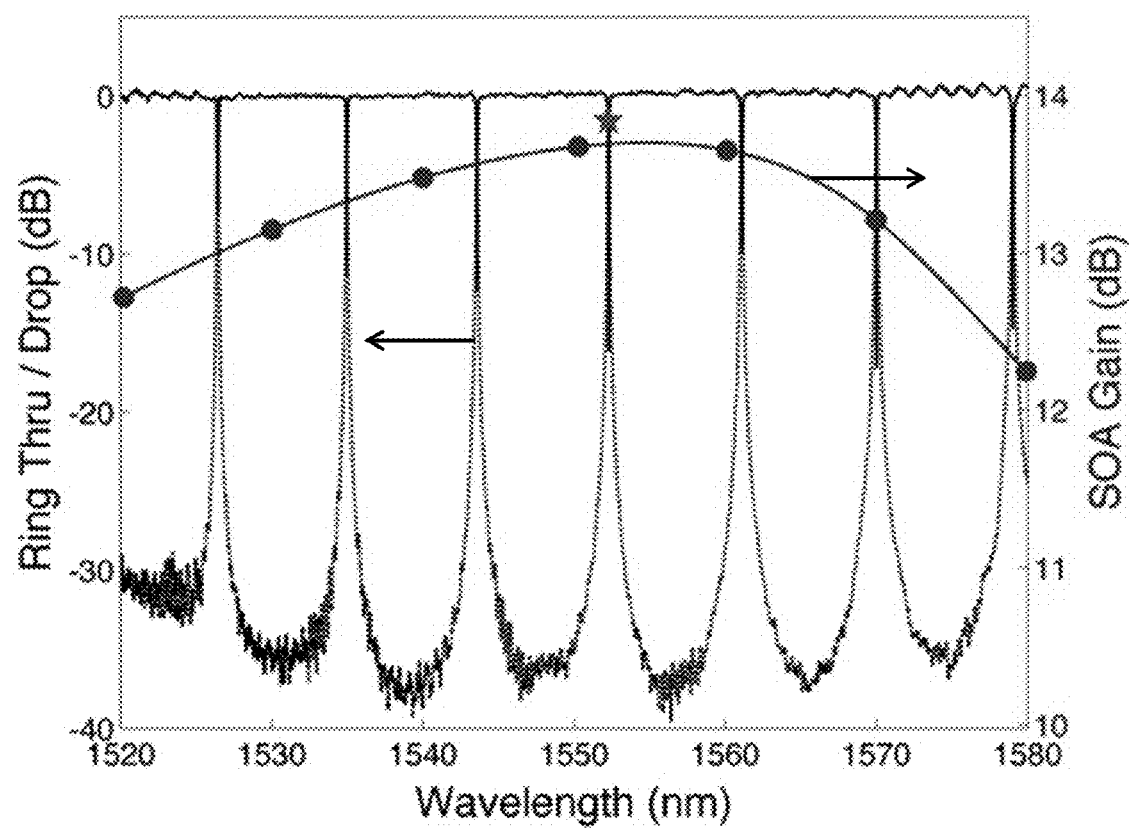
FIG. 4 Ring filter drop (solid) and through (dashed) spectrum, and SOA gain spectrum at 150 mA (blue). The expected lasing wavelength (1552.3 nm) is labeled by a red pentagram.

FIG. 4 shows a ring filter drop (solid) and through (dashed) spectrum, and SOA gain spectrum at 150 mA. The expected lasing wavelength (1552.3 nm) is indicated by a star.

From the diagram in FIG. 2, it is straightforward to see that the Sagnac loop Mirror A 240 has 100% transmittance for a DC coupling ratio of either 0 or 100%. Since the DC is symmetric, transmittance T at an arbitrary coupling length, x, can be predicted by $$T = \cos^2\left(\frac{\pi}{L}x + \varphi\right)$$

where L is the 100% coupling length, and $\varphi$ represents the contribution of coupling from waveguide bends. Reflectivity equals to 1-T since excess loss of DC is negligible. To characterize the Sagnac loop mirror transmittance or reflectivity, structures shown as Mirror A 240 in FIG. 2 with different coupling lengths, directly connected to two grating couplers, were measured using a tunable laser.

Figure 3B:
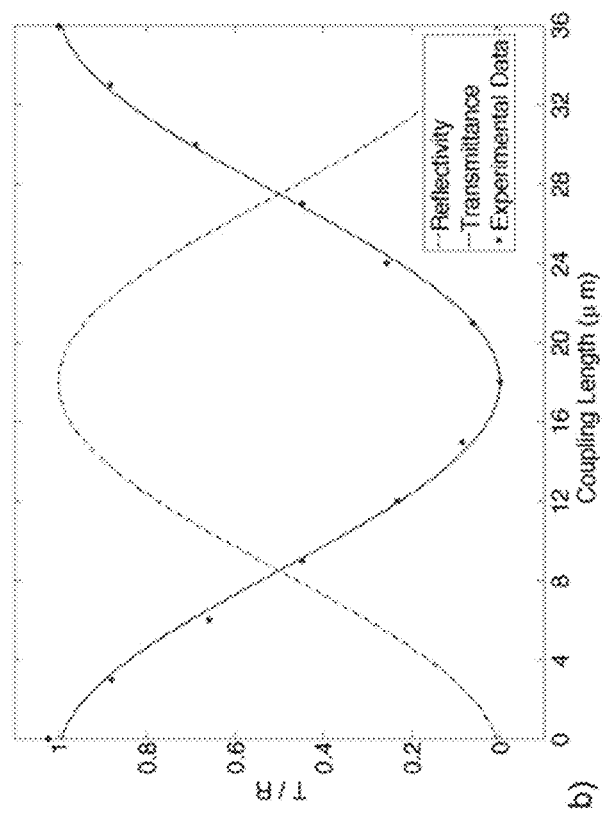
FIG. 3B is a graph of the transmittance and reflectivity of the Sagnac loop mirror as a function of DC coupling length at 1550 nm wavelength.
Figure 3A:
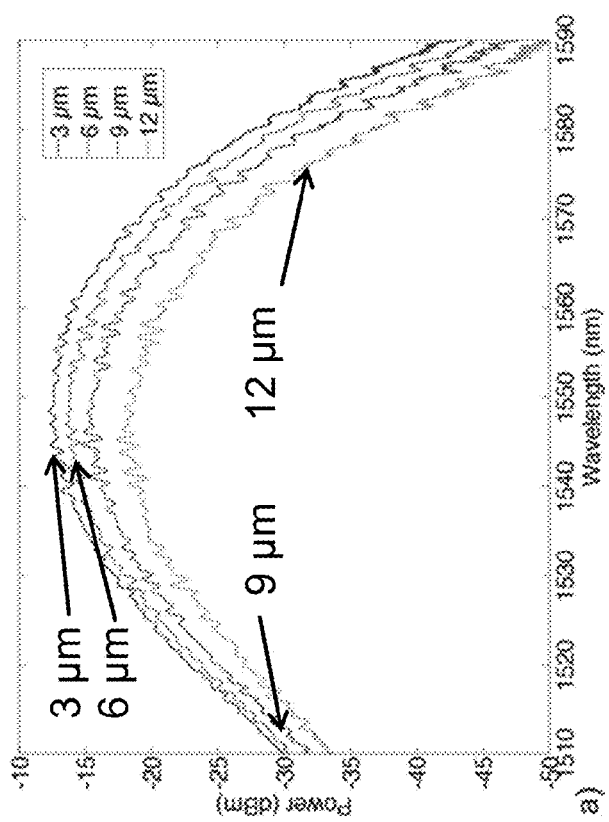
FIG. 3A is a graph of the Sagnac loop mirror transmission spectrum measured using a tunable laser and grating couplers.

FIG. 3A is a graph of the Sagnac loop mirror transmission spectrum measured using a tunable laser and grating couplers. The parabolic line shape and ripples are caused by the spectral response of the grating couplers. Reduction in power indicates decrease of transmittance as coupling length varies from 3 μm to 12 μm.

FIG. 3B is a graph of the transmittance and reflectivity of the Sagnac loop mirror as a function of DC coupling length at 1550 nm wavelength. The measured data matches well with theory, as is seen in FIG. 3B. The mirror transmittance and reflectivity can be accurately controlled by choosing the corresponding coupling length.

Figure 3C:
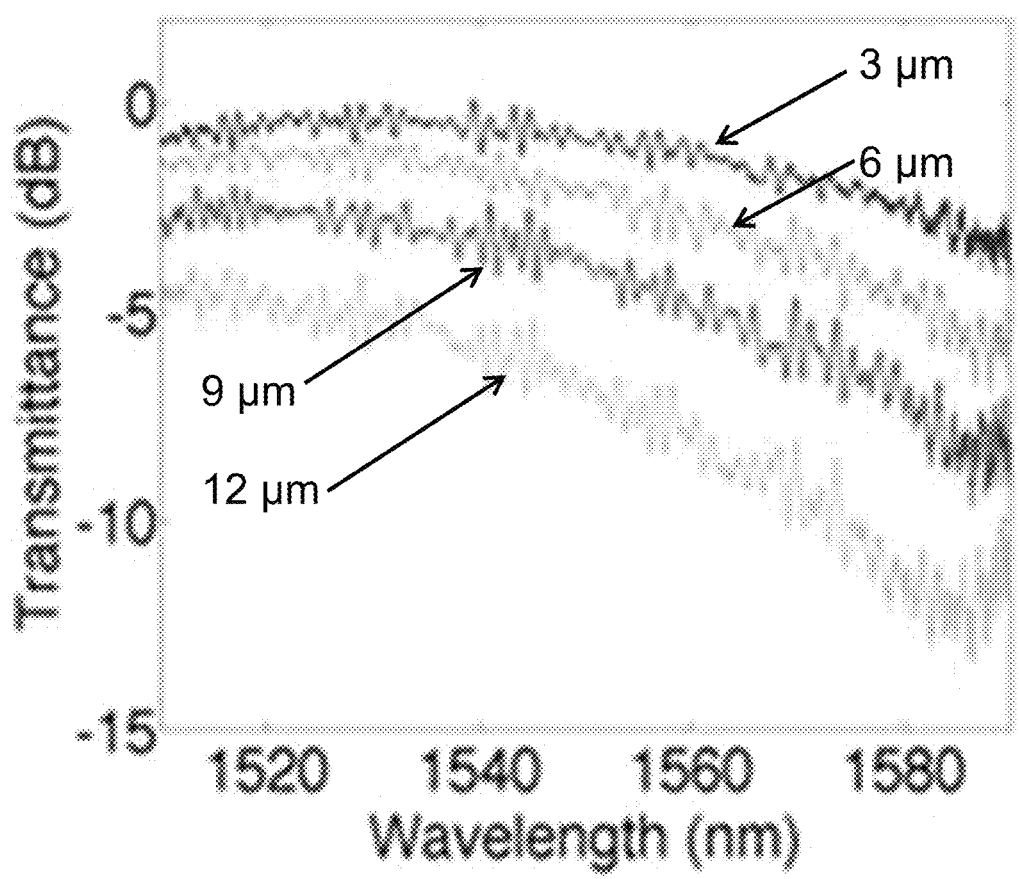
FIG. 3C is a graph of the normalized transmittance spectrum.

FIG. 3C is a graph of the normalized transmittance spectrum. Waveguide confinement decreases as the working wavelength is red shifted, hence evanescent coupling, and as a result the reflectivity of the Sagnac loop mirror, is stronger at longer wavelength, as shown in FIG. 3C.

The diced silicon chip was first polished to create a flat and smooth sidewall for edge coupling. An ultra-thin edge coupler was employed to match the SOA mode for low coupling loss, using the methods described in S. Yang, Y. Zhang, D. W. Grund, G. A. Ejzak, Y. Liu, A. Novack, D. Prather, A. E-J Lim, G-Q Lo, T. Baehr-Jones, and M. Hochberg, "A single adiabatic microring-based laser in 220 nm silicon-on-insulator," Opt. Express 22(1), 1172-1180 (2013). A half-cavity on silicon chip was aligned to the SOA using a six-axis stage.

Figures 5A, 5B:
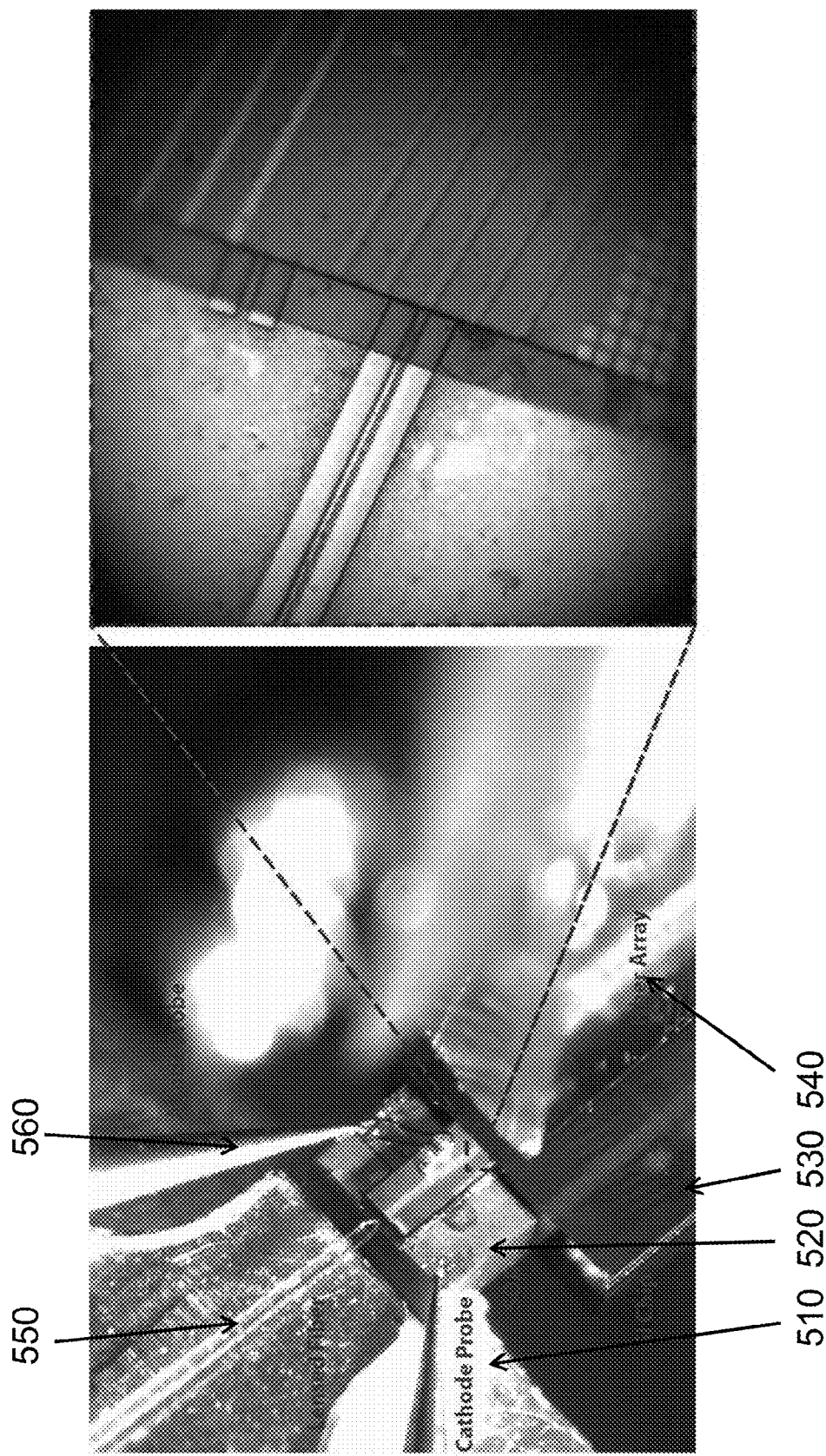
FIG. 5A is an image of the testing setup.
FIG. 5B is a close-up view of the SOA silicon chip interface.

An image of the testing setup is shown in FIG. 5A. As illustrated in FIG. 5A, a cathode probe 510 and an anode probe 560 are used to provide pump current to a SOA 520. The SOA was kept at 25° C. by a TEC. The silicon chip 530 sat on a metal chuck and stayed at room temperature, 15 to 20° C. A lensed fiber 550 was used to collect light from the high reflection end of the SOA to monitor the intra-cavity power as a feedback signal during alignment. A fiber optic bundle 540 was aligned to probe the output grating coupler.

On the silicon chip, the output grating coupler is first connected to a y-junction, which has 3 dB intrinsic loss due to power splitting and 0.3 dB excess loss. One branch of the y-junction is connected to another grating coupler 127 μm away, matching the fiber pitch in the fiber array, while the other branch lead to the output waveguide of the hybrid laser. With the hybrid laser turned off, the fiber array was actively aligned to the grating coupler loop using an Agilent laser and power meter. The grating coupler loss was simultaneously characterized to be 8.5 dB, which is higher than is typically seen during wafer scale testing, because it was kept further to the chip surface as precaution. Then the Agilent laser was turned off and hybrid laser turned on, a sharp threshold behavior near 60 mA was observed when varying the pump current.

FIG. 5B is a close-up view of the SOA silicon chip interface.

Figure 5C:
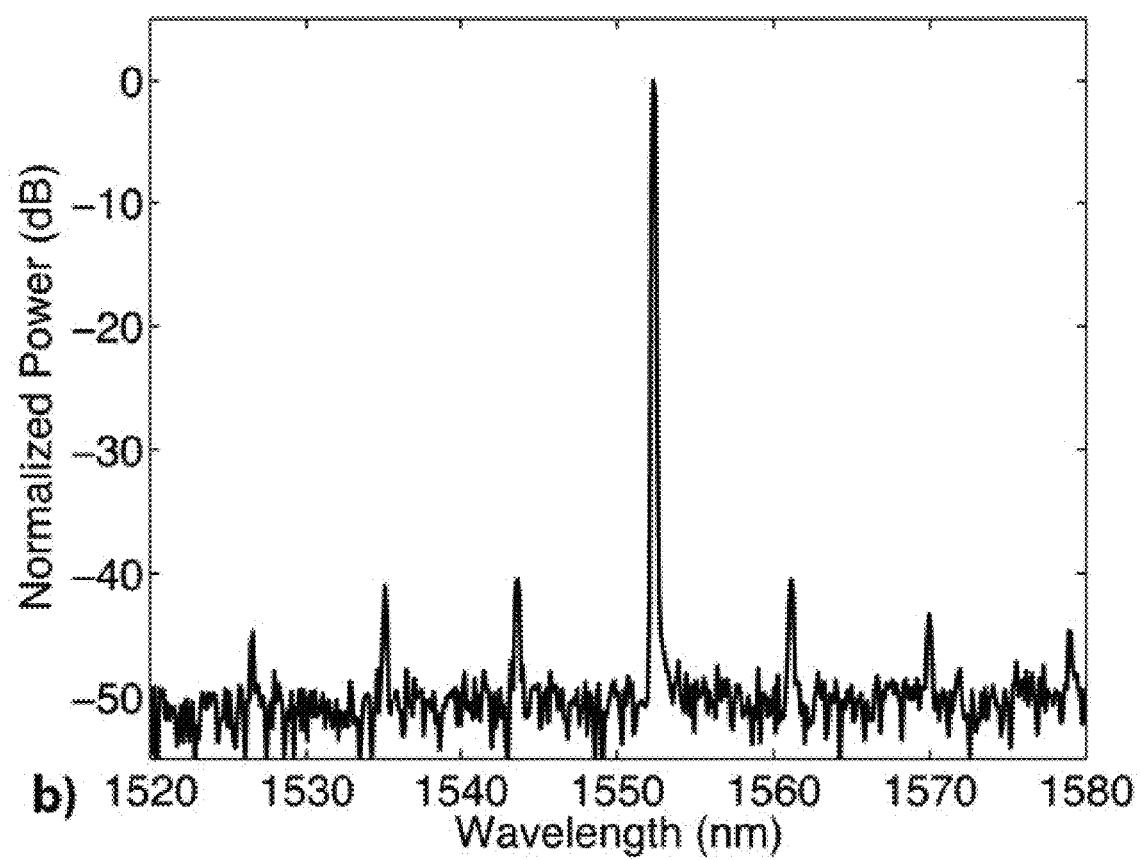
FIG. 5C is a graph of the laser spectrum measured using a fiber array shows clear fingerprints of the ring filter and 40 dB SMSR.

The measured spectrum at 170 mA pump current using an optical spectrum analyzer with 0.1 nm resolution is plotted in FIG. 5C. Fingerprints of the ring filter spectral response are clearly seen in the laser spectrum, with mode spacing equal to the ring FSR. The lasing peak appeared at 1552.3 nm, as expected from FIG. 4. The SMSR was 40 dB. On-chip power was 1.05 mW after normalizing the grating coupler insertion loss. The major contributors of cavity loss were the mirror transmittance, 90% at the Sagnac loop on silicon chip and 10% at the SOA far-end facet, as well as the coupling loss, estimated to be over 4 dB. Angled waveguides were used on both silicon chip and SOA to avoid reflection into the cavity at the chip interface.

Figure 6:
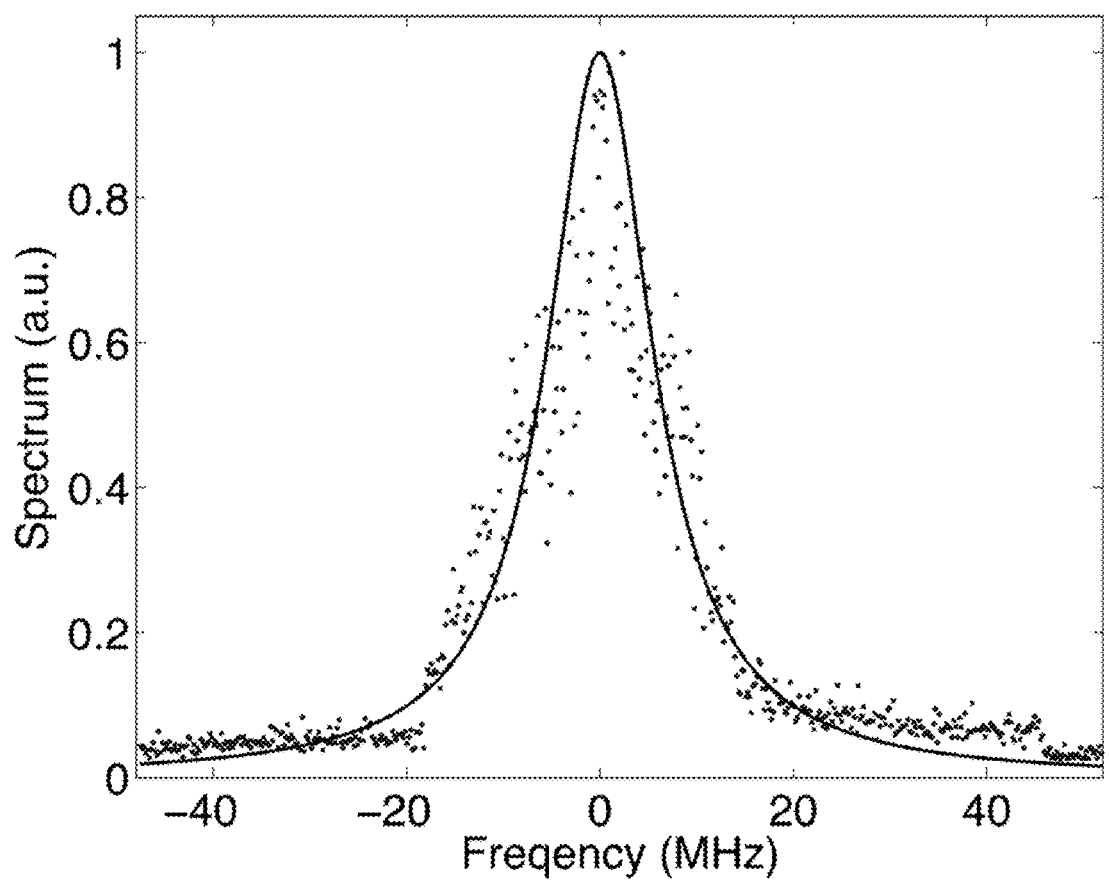
FIG. 6 is a graph of the heterodyne spectrum data (dots) and a Lorentzian fit curve with 13.27 MHz FWHM.

We performed heterodyne experiments to measure the laser linewidth. Our laser output from the fiber array was combined with the output of a narrow linewidth laser (Agilent 81600B, linewidth about 100 kHz) by a 2×2 fiber coupler. The combined optical signal (or combined optical beams) was converted into an electrical domain signal by a photodetector, whose photocurrent was fed into an RF spectrum analyzer. The heterodyne spectrum data is plotted in FIG. 6, together with a Lorentzian fit. The fitted curve shows that the FWHM of our laser is approximately 13.17 MHz.

Lithographic Micro-Ring Resonant Wavelength Control

As shown in FIG. 5C, although with a high SMSR of 40 dB, a number of longitudinal modes are available, up to 10 dB over the ASE noise floor. This is because the micro-ring is a comb filter, and the SOA gain spectrum is relatively wide and flat. The laser is vulnerable to perturbations and the lasing wavelength may hop to the next cavity longitudinal mode. It can be addressed by increasing the ring free spectral range (FSR). If the FSR is wider than the flat gain spectrum, all other cavity modes will be suppressed.

A potential drawback of micro-rings is their sensitivity to fabrication variations. For wafers processed in a commercial CMOS fab, it has been reported that the cross-wafer spread in resonant wavelength is as large as its FSR. If the micro-ring is used as a WDM modulator, the ring resonance can be thermally tuned to the nearest grid channel, thus mitigating the fabrication sensitivity to a certain extent. However, if the micro-ring is used inside a laser cavity, the non-predictability of lasing wavelength may impede the practical application of such a device.

The effect of waveguide geometry variation on micro-ring resonance wavelength can be modeled as a perturbation to the waveguide effective index. The FSR depends on the group index of the waveguide, which is immune to fabrication errors and can be accurately controlled among wafers and process lots. If the FSR is increased to be significantly larger than the random spread of wavelengths, that spread determines the range of possible lasing wavelengths. The spread depends on ring waveguide design, the SOI wafer, and silicon processing. We chose an adiabatically widened micro-ring (AMR), which has a large FSR and is more robust against fabrication variations. In an AMR, the waveguide is narrow near the coupling region to ensure single mode operation, and then is gradually widened to support tight bend geometries and a possible need to form a metal contact. For an AMR of 2 µm radius, the FSR is as large as 54 nm.

Figures 7A, 7B, 7C:
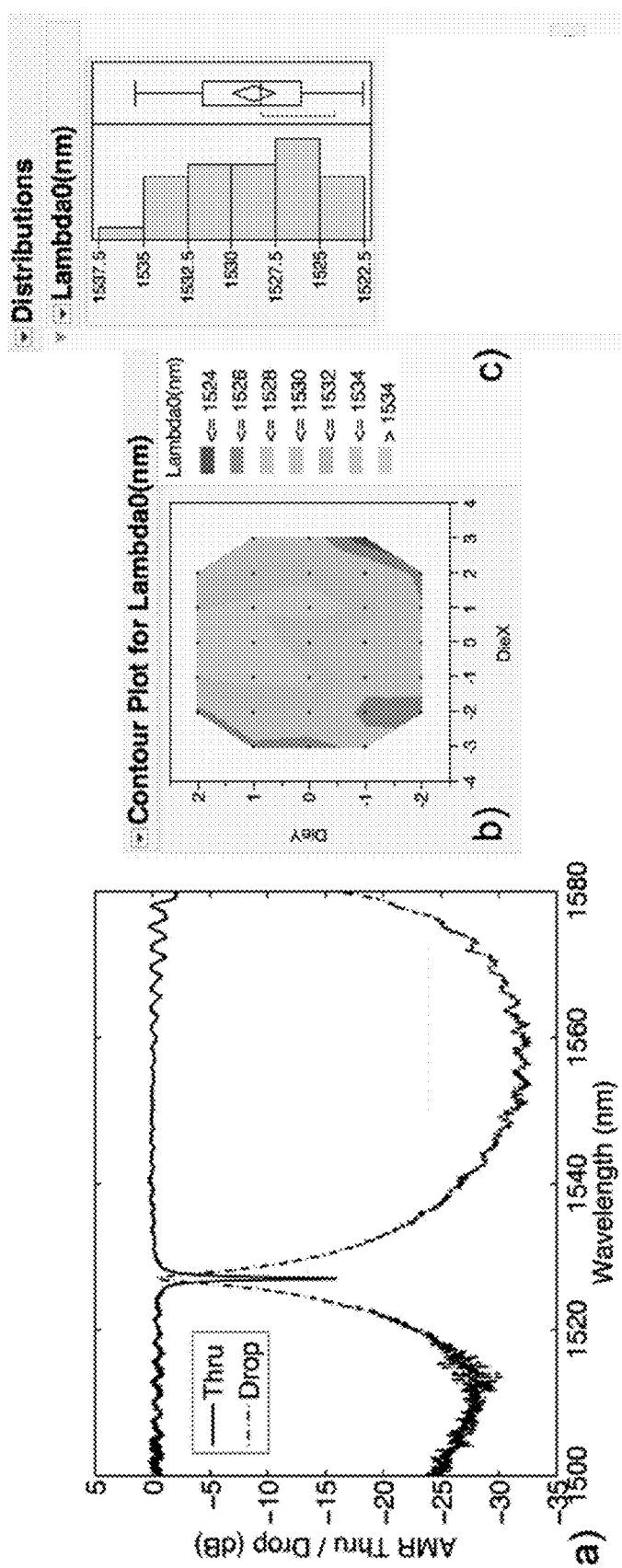
FIG. 7A is a graph showing the spectrum of the AMR drop (solid) and through (dashed) ports.
FIG. 7B is a contour plot for resonant wavelength distribution across an 8-inch wafer.
FIG. 7C is a bar chart of the statistics of the resonant wavelength distribution.

FIG. 7A is a graph showing the spectrum of the AMR drop (solid) and through (dashed) ports.

As shown in FIG. 7A, there is only one resonance peak in our testing laser's sweepable range, of 1500 nm to 1580 nm. The resonance FWHM is 1.38 nm, corresponding to a finesse of 39 or a Q-factor of 1100. We measured the same device design on all 31 complete 2.5 cm×3.2 cm reticles across an 8-inch wafer. The wafer chuck temperature was set to 30° C., where it is most stable.

FIG. 7B is a contour plot for resonant wavelength distribution across an 8-inch wafer.

FIG. 7C is a bar chart of the statistics of the resonant wavelength distribution.

The resonant wavelength distribution contours are shown in FIG. 7 B and FIG. 7C and the statistics are listed in Table 1. The mean is 1528.76 nm and the standard deviation is 3.32 nm.

Figure 7D:
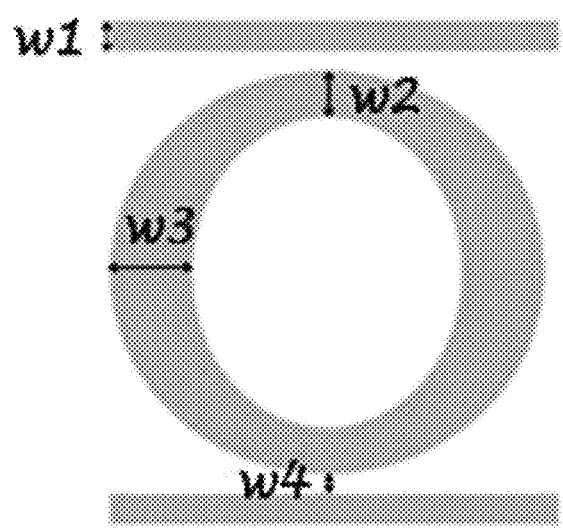
FIG. 7D is a schematic of the AMR layout. In one embodiment, w1=0.3 μm, w2=0.46 μm, w3=0.76 μm, and w4=0.2 μm.

FIG. 7D is a schematic of the AMR layout. In one embodiment, w1=0.3 µm, w2=0.46 µm, w3=0.76 µm, and w4=0.2 µm.

Figure 8:
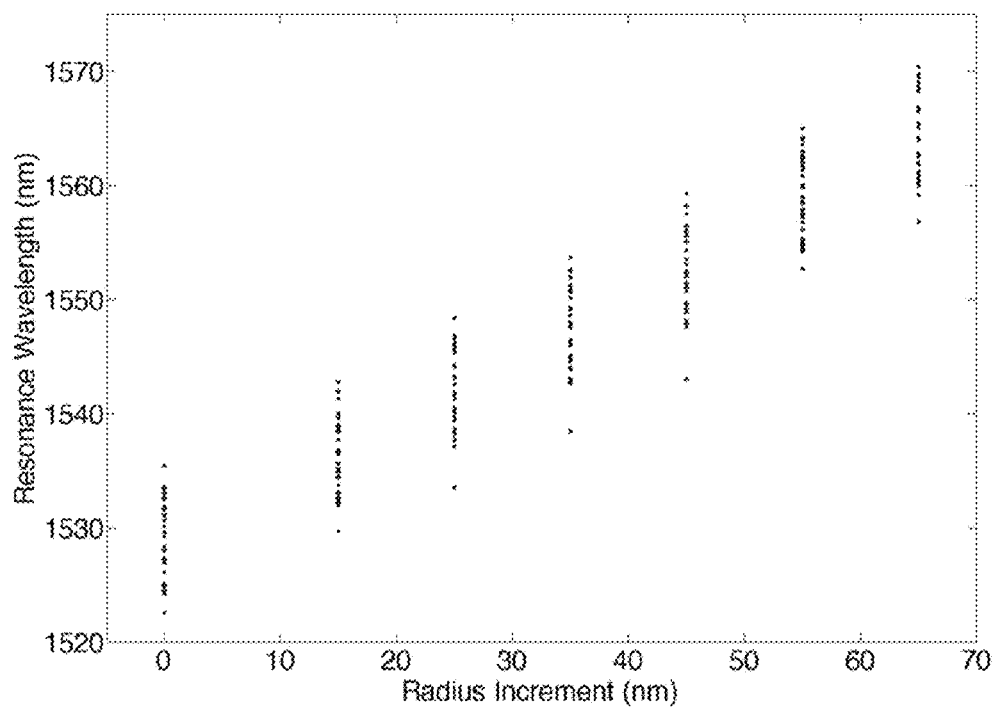
FIG. 8 is a graph that shows the AMR resonance increase as ring radius increases, measured on 31 reticles across an 8-inch wafer.

To further validate the predictability of resonant wavelength, AMRs with slightly different radii on the same wafer were also measured, and the results are summarized in FIG. 8 and Table 2. The wavelength range, maximum minus minimum, falls between 12.30 nm and 16.30 nm. The standard deviation is between 3.32 nm and 3.78 nm, with an average of 3.6 nm. The device was patterned using 248 nm lithography on SOI wafers with 20 nm thickness variations. Significant device uniformity improvement was observed by switching to 193 nm, 193 nm immersion lithography, and more uniform wafers. For WDM applications, the target wavelength can be set as the lower bound of the wavelength spread, and then locally and thermally tuned to the grid wavelength and stabilized with active feedback control. Since the tuning range is a very small fraction of the FSR, thermal tuning power is minimal.

$Si_3N_4$ Edge Coupler

In some embodiments, one may need to address the low output power because of the coupling loss at the chip interface as a result of mode mismatch between the silicon waveguide and the RSOA waveguide. The cross-section of a typical silicon waveguide is shown in FIG. 1A and its mode profile is shown FIG. 10. The near field mode profile of the RSOA waveguide is not precisely known, but typical single mode lasers have mode field diameters (MFD) around 3 µm×1 µm. To better match the RSOA mode and reduce coupling loss, one can utilize a silicon nitride waveguide edge coupler. Silicon nitride is a CMOS compatible material, and commonly used as a hard-mask, in backend of the line (BEOL) dielectrics, and as a wafer passivation layer. After the silicon waveguide is defined, 350 nm of oxide is deposited and then planarized to 100 nm above silicon waveguide top surface using chemical mechanical planarization (CMP). Thereafter 200 nm silicon nitride is deposited and patterned by lithography and dry etching.

Figure 9:
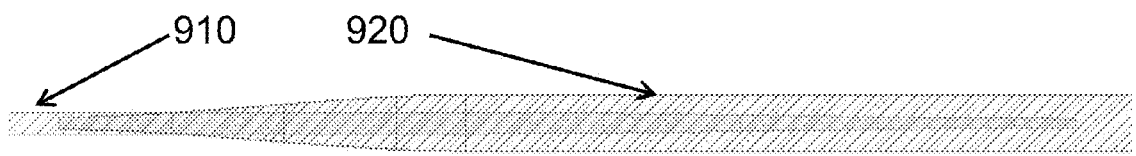
FIG. 9 is a schematic diagram of a silicon waveguide to silicon nitride waveguide coupler.

FIG. 9 is a schematic diagram of a silicon waveguide to silicon nitride waveguide coupler, in which 910 denotes silicon and 920 denotes silicon nitride.

TABLE 1

| | Quartiles | |
|---|---|---|
| 100% | Maximum | 1535.42 |
| 750% | 3$^{rd}$ Quartile | 1531.63 |
| 50% | Median | 1528.36 |
| 25% | 1$^{st}$ Quartile | 1526.09 |
| 0% | Minimum | 5122.57 |
| | Summary Statistics | |
| Mean | | 1528.7597 |
| Standard Deviation | | 3.3156392 |
| Standard Mean Error | | 0.5955064 |
| N | | 31 |

TABLE 2

| ΔR (nm) | 0 | 15 | 25 | 35 | 45 | 55 | 65 |
|---|---|---|---|---|---|---|---|
| Min | 1522.57 | 1529.71 | 1533.52 | 1538.47 | 1543.00 | 1552.70 | 1556.80 |
| Max | 1535.42 | 1542.8 | 1548.42 | 1553.70 | 1559.30 | 1565.00 | 1570.41 |
| Range | 12.85 | 13.09 | 14.90 | 15.23 | 16.30 | 12.30 | 13.61 |
| Std Dev. | 3.32 | 3.38 | 3.59 | 3.75 | 3.78 | 3.47 | 3.62 |

TABLE 3

| Band | Description | Wavelength range |
|---|---|---|
| O | Original | 1260-1360 nm |
| E | Extended | 1360-1460 nm |
| S | short wavelengths | 1460-1530 nm |
| C | conventional ("erbium window") | 1530-1565 nm |
| L | long wavelengths | 1565-1625 nm |
| U | ultralong wavelengths | 1625-1675 nm |

Figure 10:
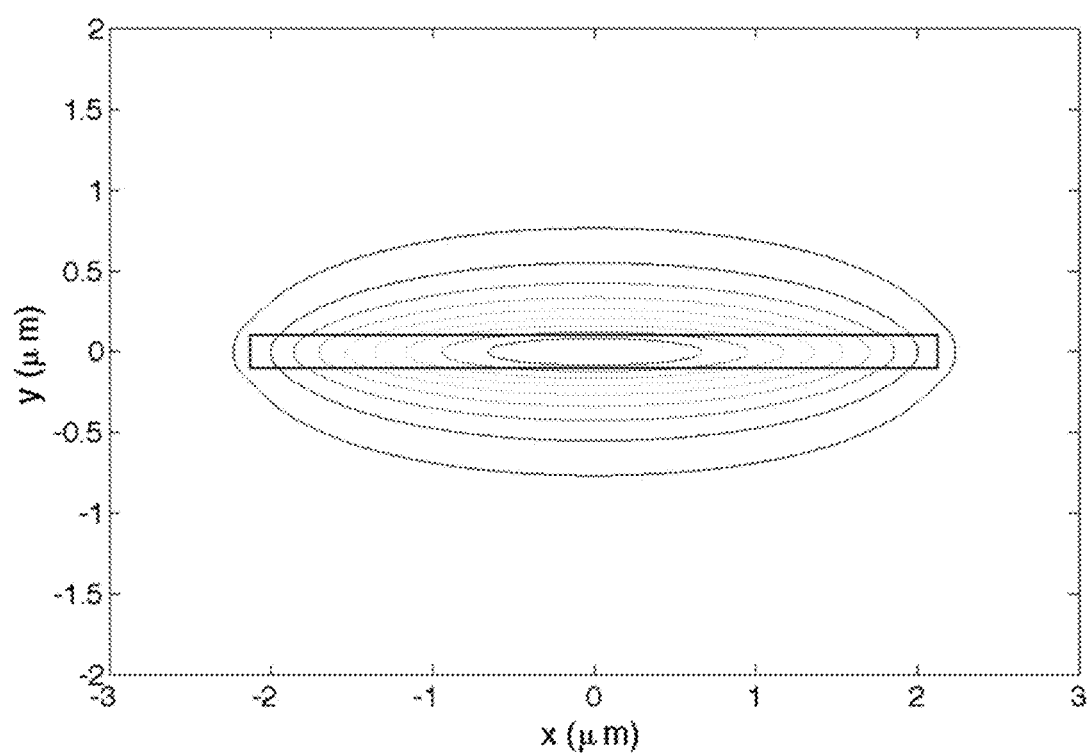
FIG. 10 is a schematic diagram illustrating the mode profile of a silicon nitride waveguide of size 4.25 μm×0.2 μm.

Light is coupled from silicon waveguide to nitride waveguide using a push-pull coupler, as shown in FIG. 9. The silicon waveguide guide width is tapered down from 0.5 μm to 0.18 μm, while the silicon nitride waveguide width increases gradually from 0.25 μm to 1.0 μm. The insertion loss of this coupler is measured to be 0.3 dB. Then the silicon nitride waveguide width is adiabatically tapered to 4.25 μm. FIG. 10 is a schematic diagram illustrating the mode profile of a silicon nitride waveguide of size 4.25 μm×0.2 μm. The refractive index of silicon nitride is 1.95-2.0. With a 0.2 μm thickness, it is guiding, but the confinement factor is low. In the vertical direction, a large portion of the mode is in the oxide cladding, as shown in FIG. 10. The MFD of this silicon nitride waveguide is 3.5 μm×0.7 μm, better matching a typical SOA mode.

Figure 11B:
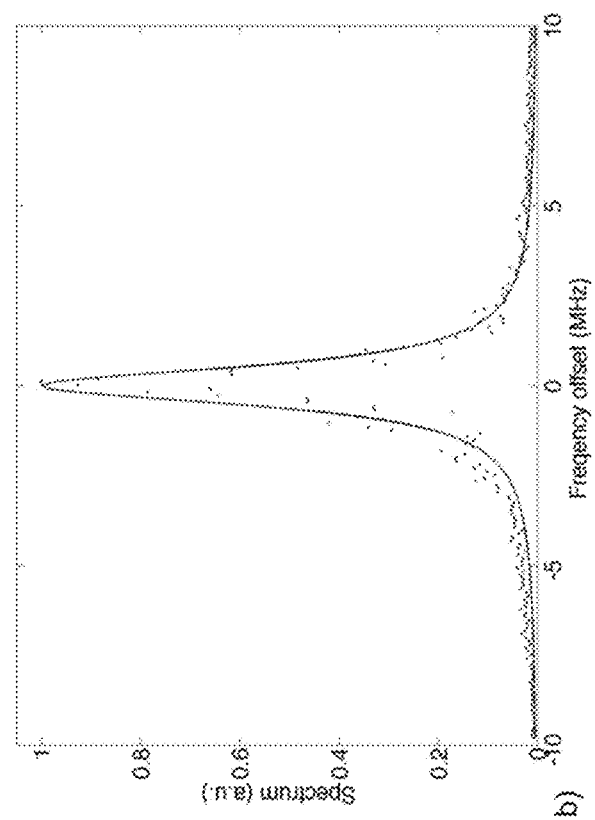
FIG. 11B is a graph of the heterodyne spectrum (dots) as a function of frequency offset and a Lorentzian fit curve with 1.28 MHz FWHM.
Figure 11A:
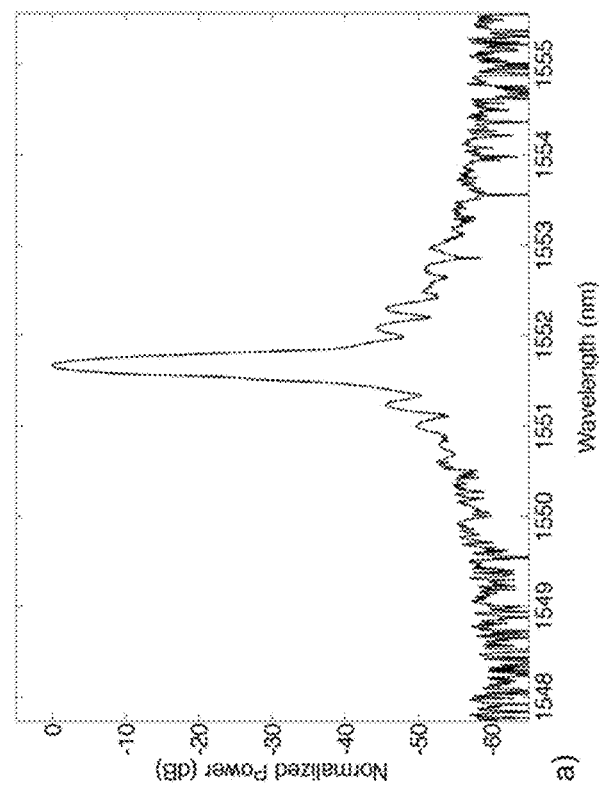
FIG. 11A is a graph of the optical spectrum as a function of wavelength with 0.1 nm resolution.

The alignment and measurement procedure previously described were repeated with the ARM and improved edge coupler. After the SOI chip, the RSOA chip and the fiber array were properly aligned and the RSOA pump current was turned on. A sharp threshold behavior near 60 mA was observed when increasing the pump current. At 170 mA, about 3 times the threshold current, optical power measured from the power meter is −5 dBm, which corresponds to on-chip power of 6.8 dBm or 4.8 mW after normalizing the 8.5 dB grating coupler insertion loss and 3.3 dB Y-junction insertion loss. The optical spectrum is plotted in FIG. 11A and the heterodyne spectrum is plotted in FIG. 11B. The Lorentzian fit of the heterodyne spectrum has a full width half maximum (FWHM) of 1.28 MHz, indicating the hybrid laser linewidth is about 1.2 MHz.

QD O-Band Laser

One major application of silicon photonics is high-speed data communications, such as optical interconnect in data centers. Short reach systems have standardized in the O-Band, the lowest dispersion wavelength window of standard single mode fibers. Table 3 lists the wavelength ranges of selected bands that are used in optical communication systems. Thus O-Band silicon photonics devices are of great interest. However, almost all devices demonstrated up to date operate at C-Band, the fiber low loss window, because of the wider availability of lasers, amplifiers, and other testing apparatus at this wavelength range.

To first order, passive device geometry scales with wavelength, free carrier plasma effect used for modulation is not wavelength sensitive, and germanium in photodetectors has stronger absorption at O-Band. The gain spectrum of typical materials cannot cover both wavelengths, so a different gain medium needs to be considered. Conventional quantum well lasers can be used, but QD lasers have better performance in terms of low threshold current and low thermal sensitivity.

A QD based RSOA was employed. It is based on indium arsenide quantum dots in gallium arsenide with aluminum gallium arsenide barriers and commercially available off-the-shelf, for example from Innolume GmbH, Konrad-Adenauer-Allee 11, 44263 Dortmund, Germany. Facet reflectivity is >99% for the high reflective end and <1% for the anti-reflective end. The silicon chip layout and alignment procedure is similar to the previous device. It inherits the unique advantages of QD lasers, and maintains the maturity of a commercial RSOA, and the CMOS compatibility of the silicon photonics chip.

Figure 12B:
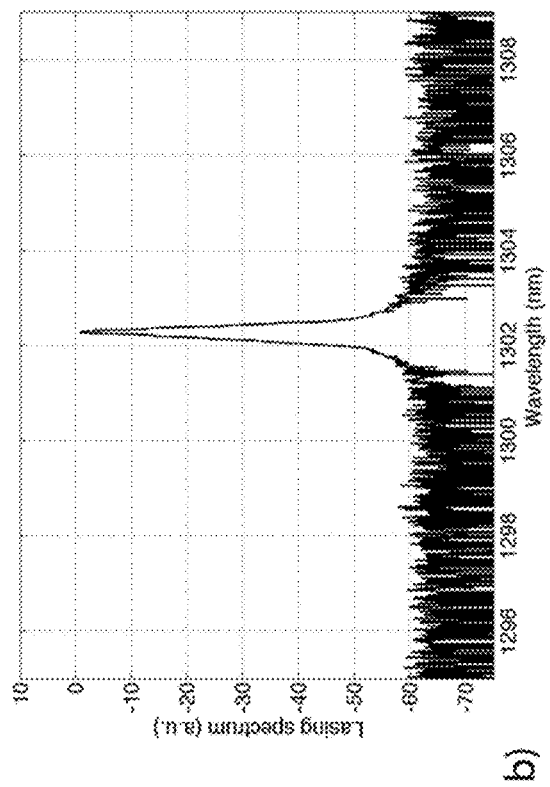
FIG. 12B is a graph of the optical spectrum of the QD O-Band laser.
Figure 12A:
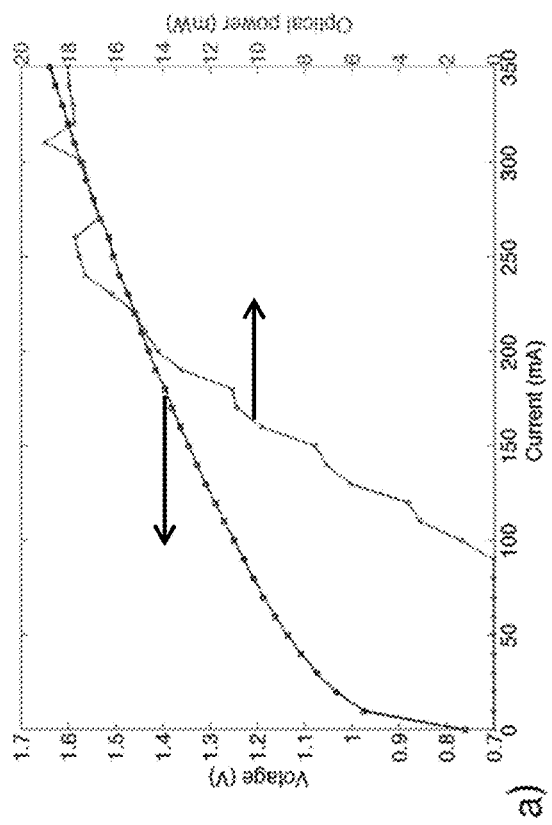
FIG. 12A is a graph of laser bias voltage and output power as a function of pump current.

FIG. 12A is a graph of laser bias voltage and output power as a function of pump current.

FIG. 12B is a graph of the optical spectrum of the QD O-Band laser.

The threshold is at 90 mA. Some kinks due to mode hopping when current is swept are also available, which is common to hybrid silicon photonics lasers. The kink near 250 mA is irregular and most likely due to mechanically or thermally induced alignment perturbations. Lasing peak appears at 1302 nm and over 50 dB SMSR is obtained.

Figure 13:
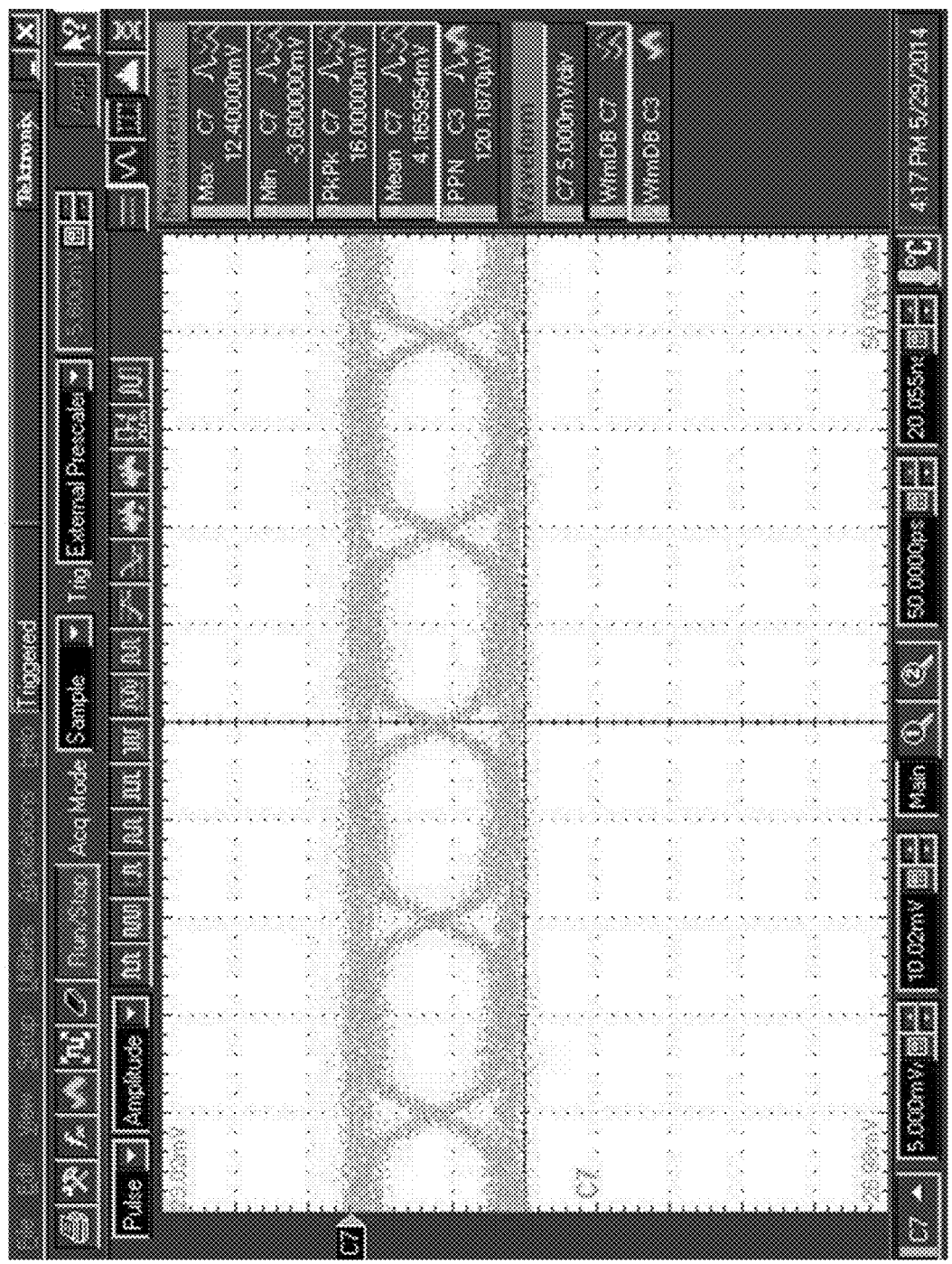
FIG. 13 is a screenshot of eye diagrams of laser output externally modulated at 10 Gb/s.

Data transmission experiments were performed to further verify the viability of the hybrid external cavity laser. The laser output is non-return to zero (NRZ) modulated using a Lithium Niobate (LiNO$_3$) Mach-Zehnder modulator, and detected using an InGaAs photodetector. The photocurrent is amplified and displayed on a digital communication analyzer (DCA). FIG. 13 is a screenshot of eye diagrams of laser output externally modulated at 10 Gb/s. A clearly open eye diagram is observed at 10 Gb/s, as shown in FIG. 13, which is an overall testament of the laser quality, including linewidth, relative intensity noise, stability and other parameters.

Figure 14B:
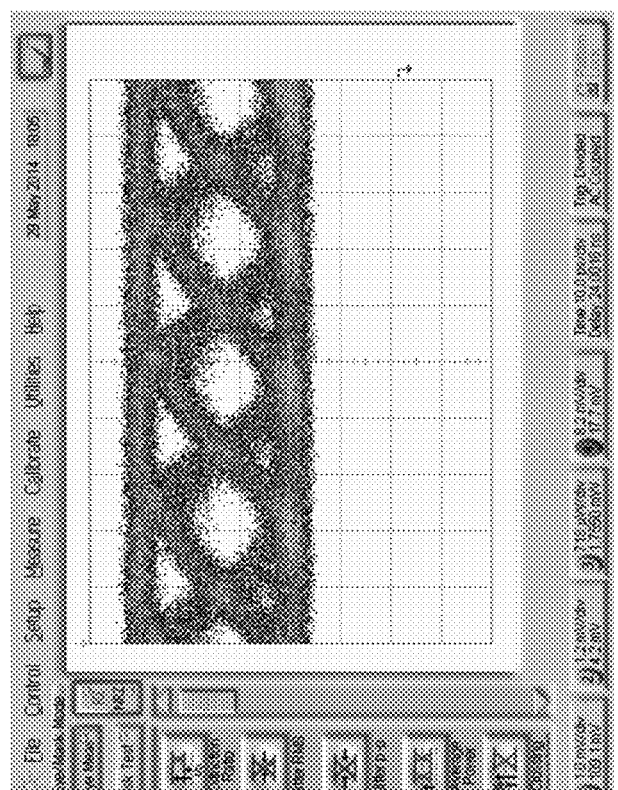
FIG. 14B is a screenshot of eye diagrams at 40 Gb/s observed using the hybrid silicon external cavity laser according to principles of the invention.
Figure 14A:
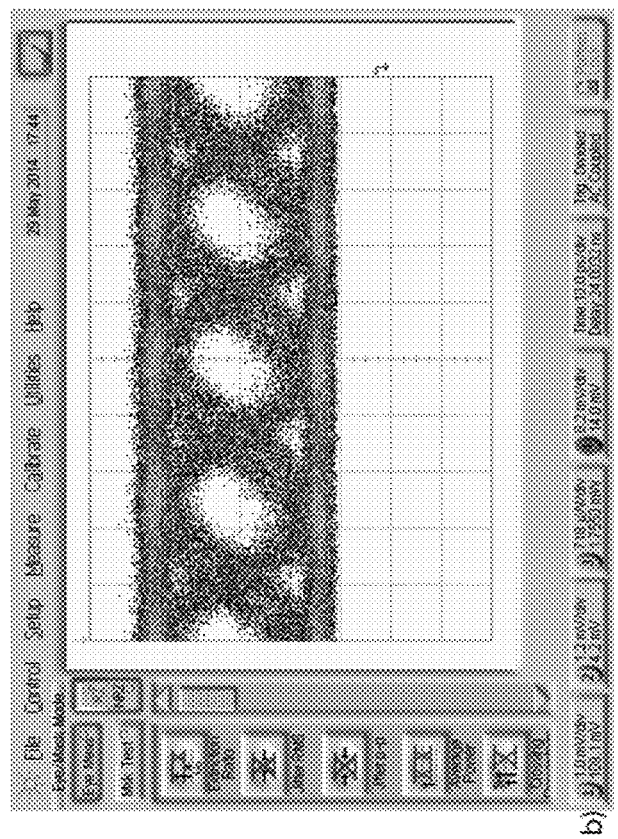
FIG. 14A is a screenshot of eye diagrams at 40 Gb/s observed in a control experiment using a commercial DFB laser.

The data rate was then increased to 40 Gb/s. A commercial DFB laser (Agere Systems A1611A/B) was used as a control. Longer rise and fall time is observed because of system bandwidth limitation. FIG. 14A is a screenshot of eye diagrams at 40 Gb/s observed in a control experiment using a commercial DFB laser.

The same tests were repeated using the hybrid silicon external cavity laser. FIG. 14B is a screenshot of eye diagrams at 40 Gb/s observed using the hybrid silicon external cavity laser according to principles of the invention. The same level of eye-openness was observed, which confirms the device under test is viable for use in high speed data application systems.

Design and Fabrication

Methods of designing and fabricating devices having elements similar to those described herein are described in one or more of U.S. Pat. Nos. 7,200,308, 7,339,724, 7,424,192, 7,480,434, 7,643,714, 7,760,970, 7,894,696, 8,031,985, 8,067,724, 8,098,965, 8,203,115, 8,237,102, 8,258,476, 8,270,778, 8,280,211, 8,311,374, 8,340,486, 8,380,016, 8,390,922, 8,798,406, and 8,818,141, each of which documents is hereby incorporated by reference herein in its entirety.

DEFINITIONS

As used herein, the term "optical communication channel" is intended to denote a single optical channel, such as light that can carry information using a specific carrier wavelength in a wavelength division multiplexed (WDM) system.

As used herein, the term "optical carrier" is intended to denote a medium or a structure through which any number of optical signals including WDM signals can propagate, which by way of example can include gases such as air, a void such as a vacuum or extraterrestrial space, and structures such as optical fibers and optical waveguides.

As used herein, the term "optical signal" is intended to denote an optical wave or an optical beam having at least one wavelength. Unless otherwise restricted, the term "optical signal" can mean, when read in context, any of a broadband signal spanning a range of wavelengths, an optical signal having a very narrow wavelength range, or an optical signal such as a laser signal having substantially a single wavelength.

THEORETICAL DISCUSSION

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

INCORPORATION BY REFERENCE

Any patent, patent application, patent application publication, journal article, book, published paper, or other publicly available material identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. An optical cavity, comprising:
   a single optical port configured to provide an optical output beam;
   a first mirror element comprising a submicron silicon waveguide, said first mirror element having a first transmittance and a first reflectivity, said first mirror element forming a first optical reflector situated at a first end of the optical cavity, said first mirror element in optical communication with said single optical port;
   a second mirror element having a second transmittance and a second reflectivity, said second mirror element forming a second optical reflector situated at a second end of the optical cavity;
   at least one of said first mirror element and said second mirror element is a Sagnac loop mirror; and
   situated in serial optical communication between said first mirror element and said second mirror element:
      a filter element configured to pass an optical beam having a selected optical wavelength therethrough; and
      a gain cavity configured to contain therein an optical gain medium.

2. The optical cavity of claim 1, wherein said first mirror element is a broadband reflector.

3. The optical cavity of claim 1, wherein said first mirror element has a reflectivity that increases as the selected wavelength is increased.

4. The optical cavity of claim 1, wherein said first mirror element has a variable reflectivity.

5. The optical cavity of claim 1, wherein said filter element is a micro-ring based filter.

6. The optical cavity of claim 1, wherein said filter element is a tunable filter.

7. The optical cavity of claim 1, wherein said filter element is a thermally tunable filter.

8. The optical cavity of claim 1, wherein said filter element has multiple pass bands.

9. The optical cavity of claim 1, wherein said second mirror has a reflectivity defined by a facet.

10. The optical cavity of claim 1, wherein said selected optical wavelength is a wavelength situated within a wavelength range used in telecommunication.

11. The optical cavity of claim 10, wherein said selected optical wavelength is a wavelength situated within the O-Band.

12. The optical cavity of claim 10, wherein said selected optical wavelength is a wavelength situated within the C-Band.

13. The optical cavity of claim 10, wherein said selected optical wavelength is a wavelength situated within a band selected from the e-Band, the S-Band, the L-Band and the U-Band.

14. The optical cavity of claim 1, wherein at least one of said first mirror element and said second mirror element is disposed on a silicon substrate, and said gain cavity contains an optical gain medium comprising a III/V semiconductor compound.

15. The optical cavity of claim 14, wherein said optical gain medium is optically coupled to said optical cavity via at least one of a butt-coupler, a taper, an inverse taper, a lens, and a lens array.

16. The optical cavity of claim 1, wherein said optical cavity is configured to be operated without cooling.

17. The optical cavity of claim 1, wherein said optical cavity is configured to be operated without hermetic sealing.

18. The optical cavity of claim 1, wherein said facet comprises an optical coating.

19. The optical cavity of claim 1, wherein said optical output beam comprises a single optical wavelength of interest.

20. The optical cavity of claim 1, wherein said optical output beam comprises a plurality of optical wavelengths of interest.

21. The optical cavity of claim 1, wherein said optical output beam comprises a narrow linewidth optical output beam.

* * * * *